(12) United States Patent
Borneman

(10) Patent No.: US 6,609,651 B1
(45) Date of Patent: Aug. 26, 2003

(54) METHOD OF SOLDERING A LEADED CIRCUIT COMPONENT

(75) Inventor: John D. Borneman, Sharpsville, IN (US)

(73) Assignee: Delphi Technologies, Inc, Troy, MI (US)

( * ) Notice: Subject to any disclaimer, the term of this patent is extended or adjusted under 35 U.S.C. 154(b) by 45 days.

(21) Appl. No.: 09/715,710

(22) Filed: Nov. 20, 2000

(51) Int. Cl.⁷ ............................................ H01L 21/441
(52) U.S. Cl. ...................... 228/245; 228/41; 228/56.3
(58) Field of Search ................ 228/245, 246, 228/41, 56.3

(56) References Cited

U.S. PATENT DOCUMENTS

| | | | | |
|---|---|---|---|---|
| 5,203,075 A | * | 4/1993 | Angulas et al. ............... 29/830 |
| 5,349,500 A | * | 9/1994 | Casson et al. ............... 361/749 |
| 5,350,105 A | * | 9/1994 | Delalle et al. .............. 228/56.3 |
| 5,597,110 A | * | 1/1997 | Melton et al. ............... 228/203 |
| 5,803,340 A | * | 9/1998 | Yeh et al. ................... 228/56.3 |
| 5,928,404 A | * | 7/1999 | Paruchuri et al. .............. 75/255 |
| 6,015,082 A | * | 1/2000 | Kivilahti ................. 228/180.22 |

* cited by examiner

Primary Examiner—M. Alexandra Elve
Assistant Examiner—Len Tran
(74) Attorney, Agent, or Firm—Jimmy L. Funke

(57) ABSTRACT

A two-part solder preform for use in attaching a leaded circuit component to a circuit board. The preform is formed by two different solid components, a first of which is formed of a lower-temperature solder alloy and the second of a higher-temperature solder alloy, in which the first solid component is present in a sufficient amount to dissolve the second solid component when the preform is heated above the melting temperature of the lower-temperature solder alloy but below the melting temperature of the higher-temperature solder alloy. Upon cooling, the preform yields a solder joint having a substantially homogenous composition, which bonds the lead to the circuit board. Preferred solder alloys for the first and second solid components are lead-free.

10 Claims, 3 Drawing Sheets

METHOD OF SOLDERING A LEADED CIRCUIT COMPONENT

TECHNICAL FIELD

The present invention generally relates to solder preforms of the type used to attach leaded circuit components to circuit boards. More particularly, this invention relates to a two-part solder preform formed by two different solder compositions, a lower-temperature solder alloy and a higher-temperature solder alloy, so that the preform can be flowed to form a solder joint at a lower temperature than the melting temperature of the higher-temperature solder alloy.

BACKGROUND OF THE INVENTION

Circuit components are at times electrically and physically connected to circuit boards with wire leads. Such leaded components are mounted to a circuit board by inserting their leads in plated through-holes provided in the circuit board, and then soldering the leads to metallization (e.g., metal runners) on the opposite side of the board, forming side-to-side connections. The solder may be applied by wave soldering or provided in the form of a paste applied to the leads, and then flowed to form solder joints. If wave soldering or the use of a solder paste is not practical or possible, a less widely used alternative is to use solder preforms that are assembled individually on the leads of a leaded component. Preforms are usually formed as rings, but may be formed from a flat sheet material that is stamped to yield various complex shapes that can be assembled to the leads of certain leaded components.

A current trend in the electronic industry is to reduce the amount of lead used in the processing and assembly of electronic devices. Many of the more suitable candidates for lead-free solder alloys have melting or liquidus temperatures significantly higher than the often-used Sn63—Pb37 eutectic alloy (melting temperature of 183° C.). Because many electronic components and processes are designed and validated for reflow temperatures developed for tin-lead alloys, there is a concern that the temperatures required to reflow lead-free solder alloys could potentially damage the component being soldered as well as surrounding components on the same circuit board. While components and processes that may be sensitive to higher reflow temperatures can be developed and validated for the higher reflow temperatures of the lead-free solder alloys, such an undertaking is very costly.

U.S. Pat. No. 5,803,340 to Yeh et al. discloses a solder paste composition that contains fine powders of two or more different solder alloys, one of which has a lower melting temperature than the other. The solder paste is characterized by the ability to flow at the melting temperature of the lower-melting alloy, and then upon subsequent reheating to the melting temperature of the higher-melting alloy, remelt both alloys to yield a solder joint having a homogenous composition. Such two-component solder pastes have found use for flip chips and other surface-mount technology (SMT) devices attached to circuit boards with solder bumps that are formed on the devices and then reflowed to solder the devices to the board. Solder pastes in accordance with Yeh et al. provide a lower bumping temperature and a higher reflow temperature to yield a solder joint capable of withstanding high temperatures as a result of having a melting temperature between the bumping and reflow temperatures of the original paste. However, such an approach has not been applied to solder preforms used for leaded circuit components. One reason is that leaded components are mounted to circuit boards after SMT devices have been mounted and reflowed. SMT devices are vulnerable to downstream processes that can raise the temperature of their fine-pitch solder connections above the solder melting temperature, causing the solder connections to reflow and create shorts and open circuits. If a preform containing lower and higher-melting solder alloys were used, one would expect that the process of soldering a leaded component to a circuit board with the preform would induce unacceptably high thermal stresses in adjacent SMT devices as well as the substrate, device packages and connections. In addition, there is a concern that adjacent SMT solder connections, and particularly those of fine-pitch flip chips and other fine-pitch SMT devices, would reflow unless both the lower and higher-melting solder alloys of the preform had melting temperatures that are sufficiently below the melting temperature of the SMT solder connections. As previously discussed, another drawback would be that the leaded components and their processing would require costly revalidation at the reflow temperature of the higher-melting solder alloy.

SUMMARY OF THE INVENTION

The present invention provides a two-part solder preform for use in attaching a leaded circuit component to a circuit board. The solder preform is formed by two different solid components, a first of which is formed of a lower-temperature solder alloy and the second of a higher-temperature solder alloy. According to the invention, when present in a sufficient amount, intimate contact between the first and second solid components enables the first solid component to dissolve the second solid component when the preform is heated above the melting temperature of the lower-temperature solder alloy but below the melting temperature of the higher-temperature solder alloy.

Solder preforms in accordance with this invention may be provided in several different forms. For use with leaded circuit components, the preform preferably has an annular shape, though various other shapes and forms could be suitable. In one form, the first and second solid components are formed separately, and then stacked to form the preform. In another form, the preform is a unitary member in which the first and second solid components are mechanically joined, such as by lamination. In a third form, the first and second solid components are powders that are mixed and compacted together to form the preform. In each case, the two-part solid solder preform of this invention is formed by mechanically combining the first and second solid components. After assembling the preform to a lead of the circuit component, the preform is heated to a temperature above the melting or liquidus temperature of the lower-temperature alloy of the first solid component, but below the liquidus temperature of the higher-temperature alloy of the second solid component. According to the invention, the first solid component constitutes a sufficient amount of the preform so that when the first solid component melts, the lower-temperature alloy dissolves substantially all of the higher-temperature alloy. Upon cooling, the two-part solid solder preform yields a solder joint having a substantially homogenous composition, and bonds the lead to the circuit board. Preferred solder alloys for the first and second solid components are lead-free, with the alloy for the second solid component and the composition of the final solder joint having melting temperatures well above that of the conventional Sn63—Pb37 eutectic alloy (melting temperature of 183° C.).

In view of the above, it can be seen that a significant advantage of the present invention is that it provides a method for soldering a leaded component to a circuit board using a soldering temperature below the melting temperature of the higher-melting component of the preform. As a result, this invention enables the soldering of leaded components with a high-temperature lead-free solder alloy, yet at a soldering temperature well below the melting temperature of the alloy. The lower-temperature alloy of the preform can be selected so that the soldering temperature is not higher than the reflow temperatures of tin-lead alloys with which all of the electronic components on the same circuit board were designed and validated. Consequently, the invention avoids the concern that the temperature required to reflow a lead-free solder alloy for a leaded component could potentially damage the component being soldered as well as surrounding components on the same circuit board. The invention also avoids the necessity for revalidating components and processes at higher temperatures.

Other objects and advantages of this invention will be better appreciated from the following detailed description.

DESCRIPTION OF THE PREFERRED EMBODIMENT

Figure 1:
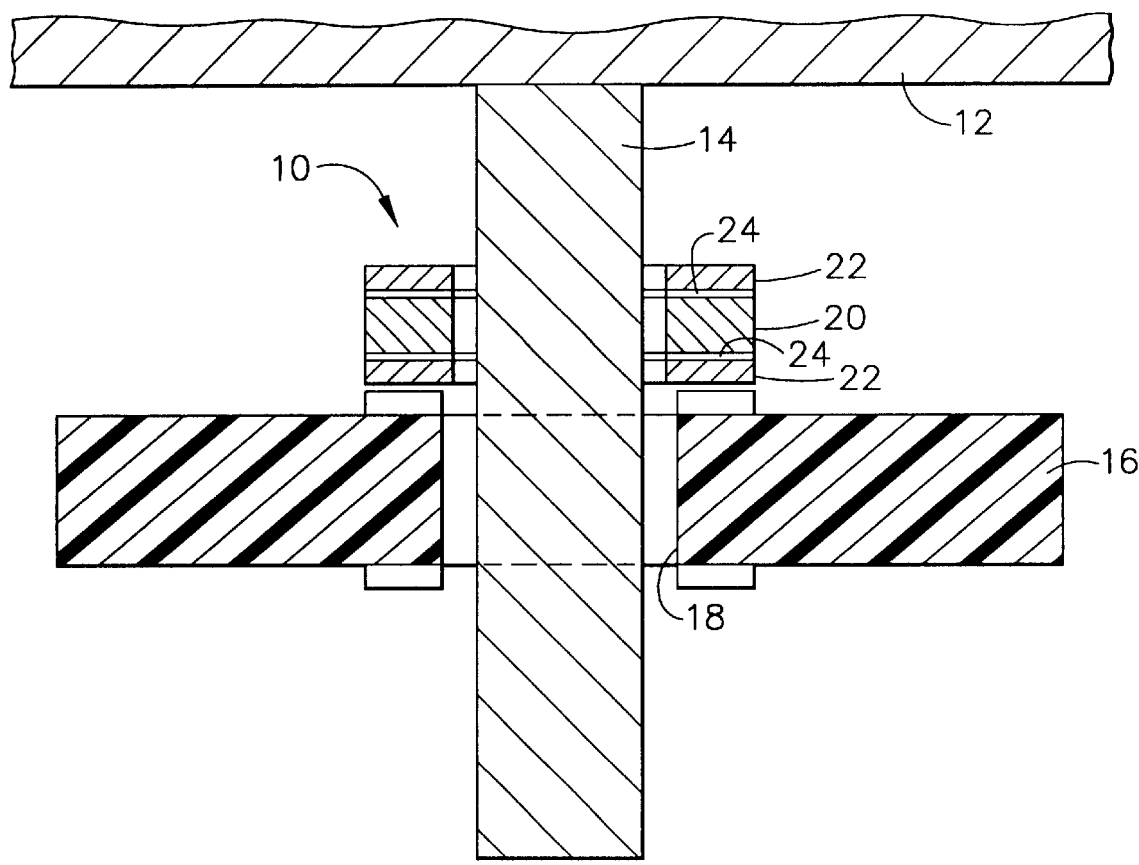
FIGS. 1 through 3 are cross-sectional views of two-component solder preforms assembled to a lead of a circuit component mounted to a circuit board in accordance with three different embodiments of the invention.
Figure 2:
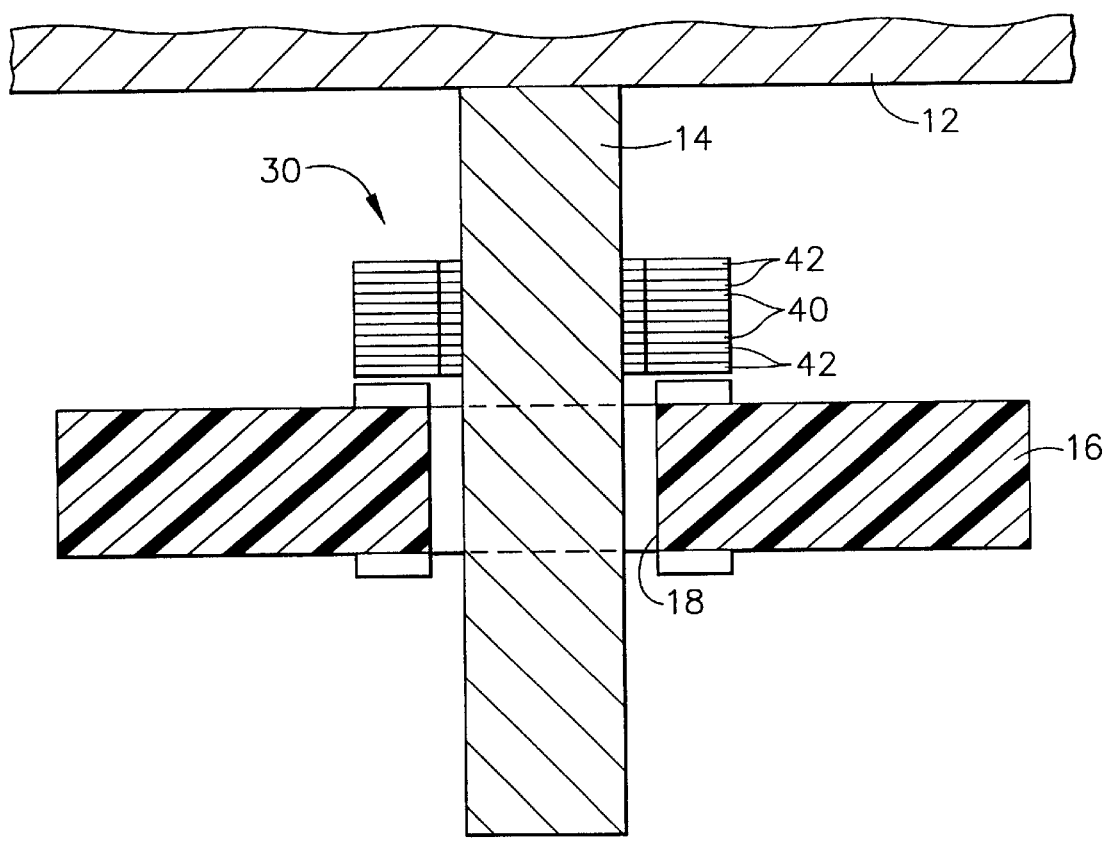
Figure 3:
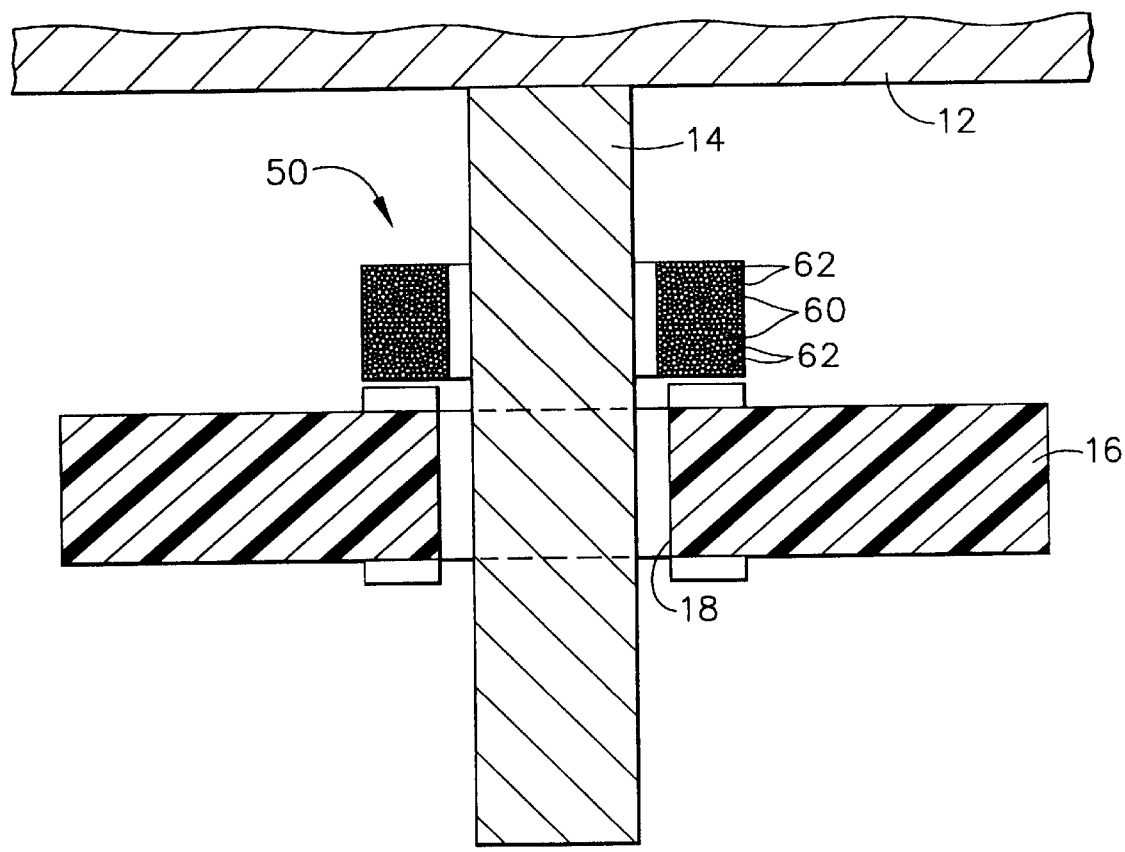

FIGS. 1 through 3 show two-component solder preforms 10, 30 and 50 configured in accordance with the present invention. As represented in each of the Figures, the preforms 10, 30 and 50 are solid, as opposed to a paste, and assembled to the lead 14 of a circuit component 12 mounted to a circuit board 16. The lead 14 is inserted into a plated through-hole 18 in the board 16, as is conventional for leaded circuit components. In accordance with the invention, each of the preforms 10, 30 and 50 is composed of two different solid components, each formed of a different solder alloy, though it is foreseeable that additional solid components formed of different solder alloys could be employed to form the preforms 10, 30 and 50.

With reference to FIG. 1, the preform 10 is shown as being composed of three disks 20 and 22 that intimately contact each other. The disk 20 is formed from a solder alloy having a lower melting temperature than the solder alloy from which the two remaining disks 22 are formed. The disks 20 and 22 are shown as being discrete bodies that are stacked together on the lead 14 prior to inserting the lead 14 in the through-hole 18. A flux compound 24 is shown as being present between the disks 20 and 22. Alternatively, the flux compound 24 could be applied after the disks 20 and 22 are stacked on the lead 14, or applied separately during the soldering operation. To solder the lead 14 to the circuit board 16, the preform 10 is reflowed using a suitable technique, such as with hot gas, focused light, a laser beam, a soldering iron, etc. During the soldering operation, the preform 10 is not heated sufficiently to melt the disks 22, but instead only to melt the lower-temperature disk 20. According to the invention, if the disks 20 and 22 are in intimate contact and the disk 20 is sufficiently large as compared to the disks 22 combined, the molten alloy of the disk 20 dissolves the disks 22 by alloying with their alloy, effectively pulling the disks 22 into solution to yield a final solder alloy whose melting temperature is between that of the alloys used to form the disks 20 and 22. For example, if the disk 20 is formed of a Sn—58Bi eutectic alloy having a melting temperature of 138° C., and the disks 22 are formed of a Sn—3.5Ag eutectic alloy having a melting temperature of 221° C., the resulting alloy would be a SnAgBi alloy having solidus and liquidus temperatures between 138° C. and 221° C. The particular solidus and liquidus temperatures of the final alloy would obviously be dependent on the relative amounts of the Sn—58Bi and Sn—3.5Ag alloys present, which in turn is dependent on the number and relative sizes of the disks 20 and 22.

In one embodiment, a Sn—58Bi disk 20 and two Sn—3.5Ag disks 22 are combined to constitute, by weight, about 8.2% and about 91.8% of the preform 10, respectively (i.e., a weight ratio of about 8 to 92). Heating the preform 10 to a temperature above the melting temperature of the disk 20 (138° C.) but below the melting temperature of the disks 22 (221° C.), melts the disk 20, dissolves the disks 22, and yields a final solder composition of Sn—3.2Ag—4.8Bi having a solidus temperature of about 211 C. and a liquidus temperature of about 216° C. In order to sufficiently dissolve the Sn—3.5Ag disks 22, it is believed that the Sn—58Bi disk 20 (or multiple disks of the same alloy) should constitute at least 8 weight percent of the preform 10, such that the Sn—3.5Ag disks 22 constitute not more than 92 weight percent of the preform 10.

The preform 30 shown in FIG. 2 is composed of multiple laminated layers 40 and 42, with the layers 40 being formed from a solder alloy having a lower melting temperature than the solder alloy from which the remaining layers 42 are formed. The preform 30 can be formed by laminating or pressing together one sheet of each of the solder alloys, and then folding and relaminating the resulting sheet multiple times until a desired number of layers are obtained. The preform 30 can then be stamped or formed from this lamination stack. Depending on the alloys used for the layers 40 and 42, the lamination, folding and stamping/forming operations may need to be performed in a controlled atmosphere, e.g., a nonoxidizing atmosphere. The lamination stack and/or preform 30 may be annealed to facilitate processing.

A flux compound (not shown) may be applied prior to or between folding operations, applied to the exterior of the finished preform 30, or applied separately during the soldering operation. Soldering the lead 14 to the circuit board 16 entails the same process as described in reference to FIG. 1, with the preform 30 being heated sufficiently to melt the low-temperature layers 40 but not the high-temperature layers 42. Instead, because the layers 40 and 42 intimately contact each other and provided there is sufficient volume of the low-temperature layers 40, the layers 40 when molten will draw the alloys of the higher-temperature layers 42 into solution to yield the desired final solder alloy, which is then cooled to form a solder joint that bonds the lead 14 to the circuit board 16. While the preform 30 is shown as containing multiple layers 40 and 42 of each alloy, a single layer 40 and 42 of each alloy could be used by performing only the first lamination step, omitting the subsequent folding and relamination operations.

Finally, the preform 50 shown in FIG. 3 is shown as being formed from powders 60 and 62 of two different solder alloys, one of which having a lower melting temperature than that of the other. The preform 30 is formed by compacting the powders 60 and 62 together, and optionally heating the powders to facilitate compaction and thereby promote intimate contact between the particles of the powders 60 and 62 as well as increase the final density of the preform 50. The powders 60 and 62 preferably have particles sizes that will promote dissolving the particles of the higher-temperature powder 62 with the lower-temperature powder 60. Depending on the alloys used for the layers 40 and 42, the compaction operation may need to be performed in a controlled atmosphere, e.g., a nonoxidizing atmosphere. A flux compound (not shown) may be mixed with the powders 60 and 62, applied to the exterior of the finished preform 50, or applied separately during the soldering operation. Soldering the lead 14 to the circuit board 16 entails the same process as that described in reference to FIGS. 1 and 2.

While our invention has been described in terms of a preferred embodiment, other forms could be adopted by one skilled in the art. For example, alternate or additional processing steps could be employed, or solder alloy compositions other than those specifically noted could be used. Accordingly, the scope of our invention is to be limited only by the following claims.

What is claimed is:

1. A method for attaching a leaded circuit component to a circuit board, the method comprising the steps of:

forming a solid solder preform by mechanically combining a first solid solder alloy and a second solid solder alloy, the first solder alloy having lower liquidus and solidus temperatures than the second solder alloy;

assembling the solid solder preform to a lead of the circuit component;

heating the solid solder preform to a temperature above the liquidus temperature of the first solder alloy but below the liquidus temperature of the second solder alloy so that the first solder alloy melts and dissolves substantially all of the second solder alloy; and then cooling to yield a solder joint having a substantially homogenous composition, the solder joint bonding the lead to the circuit board.

2. A method according to claim 1, wherein the solid solder preform is formed to be an annular-shaped disk.

3. A method according to claim 1, wherein the first and second solder alloys are formed to be separate annular-shaped disks, the first and second solder alloys being stacked on the lead to form the solid solder preform.

4. A method according to claim 1, wherein the first and second solder alloys are layers that are mechanically joined to form the solid solder preform.

5. A method according to claim 4, wherein the solid solder preform is formed to comprise multiple layers of the first solder alloy.

6. A method according to claim 1, wherein each of the first and second solder alloys is a powder, the first and second solder alloys being mixed and compacted together to form the solid solder preform.

7. A method according to claim 1, wherein the first and second solder alloys are present in the solid solder preform at a ratio of at least 8 parts-by-weight of the first solder alloy to not more than 92 parts-by-weight of the second solder alloy.

8. A method according to claim 1, wherein the first solder alloy is Sn—58Bi alloy and the second solder alloy is Sn—3.5Ag alloy, and the first and second solder alloys are present in the solid solder preform at a weight ratio of about 8 to about 92, respectively.

9. A method for attaching a leaded circuit component to a circuit board, the method comprising the steps of:

forming at least one solid annular-shaped disk of a first solder alloy and at least one solid annular-shaped disk of a second solder alloy, the first and second solder alloys being lead-free, the first solder alloy having lower liquidus and solidus temperatures than the second solder alloy;

forming a solid solder preform by stacking the disks of the first and second solder alloys on a lead of the circuit component, the lead being inserted through openings in the disks;

heating the solid solder preform to a temperature above the liquidus temperature of the first solder alloy but below the liquidus temperature of the second solder alloy so that the disk of the first solder alloy melts and the first solder alloy dissolves substantially all of the second solder alloy; and then cooling to yield a solder joint having a substantially homogenous composition, the solder joint bonding the lead to the circuit board.

10. A method for attaching a leaded circuit component to a circuit board, the method comprising the steps of:

forming an annular-shaped solid solder preform by mechanically combining a first solid solder alloy and a second solid solder alloy, the first and second solder alloys being lead-free, the first solder alloy having lower liquidus and solidus temperatures than the second solder alloy, the first and second solid solder alloys being mechanically combined using a technique chosen from the group consisting of laminating sheets of the first and second solid solder alloys such that the solid solder preform is a unitary member, and compacting powders of the first and second solid solder alloys such that the solid solder preform is a unitary member;

assembling the solid solder preform to a lead of the circuit component by inserting the lead through an opening in the solid solder preform;

heating the solid solder preform to a temperature above the liquidus temperature of the first solder alloy but below the liquidus temperature of the second solder alloy so that the first solder alloy melts and dissolves substantially all of the second solder alloy; and then cooling to yield a solder joint having a substantially homogenous composition, the solder joint bonding the lead to the circuit board.

* * * * *